United States Patent [19]

Ogita

[11] 4,124,780
[45] Nov. 7, 1978

[54] FM STEREOPHONIC RECEIVER PROVIDING A TEST SIGNAL

[75] Inventor: Minoru Ogita, Hamamatsu, Japan

[73] Assignee: Nippon Gakki Seizo Kabushiki Kaisha, Hamamatsu, Japan

[21] Appl. No.: 848,529

[22] Filed: Nov. 3, 1977

[30] Foreign Application Priority Data

Nov. 18, 1976 [JP] Japan .................... 51-154799[U]

[51] Int. Cl.² .............................................. H04H 5/00
[52] U.S. Cl. ................................ 179/15 BT; 325/363; 331/179
[58] Field of Search ............. 179/15 BT; 325/36, 363; 331/179

[56] References Cited

U.S. PATENT DOCUMENTS 2,121,434  6/1938  Klinedinst et al. .................... 325/36

Primary Examiner—Kathleen H. Claffy
Assistant Examiner—Kenneth A. Chayt
Attorney, Agent, or Firm—Cushman, Darby & Cushman

[57] ABSTRACT

An FM stereophonic receiver includes a system for producing a test signal having an audio frequency and a constant amplitude, permitting an easy setting of the input level of a tape-recorder which will record an FM program through the receiver. The system is so arranged that the oscillation frequency of a voltage-controlled oscillator involved in a phase-locked loop circuitry of a multiplex decoder in the receiver can be changed so as to make it possible to derive the test signal from a certain point in the circuitry. No separate audio signal generator is required for producing the test signal.

10 Claims, 1 Drawing Figure

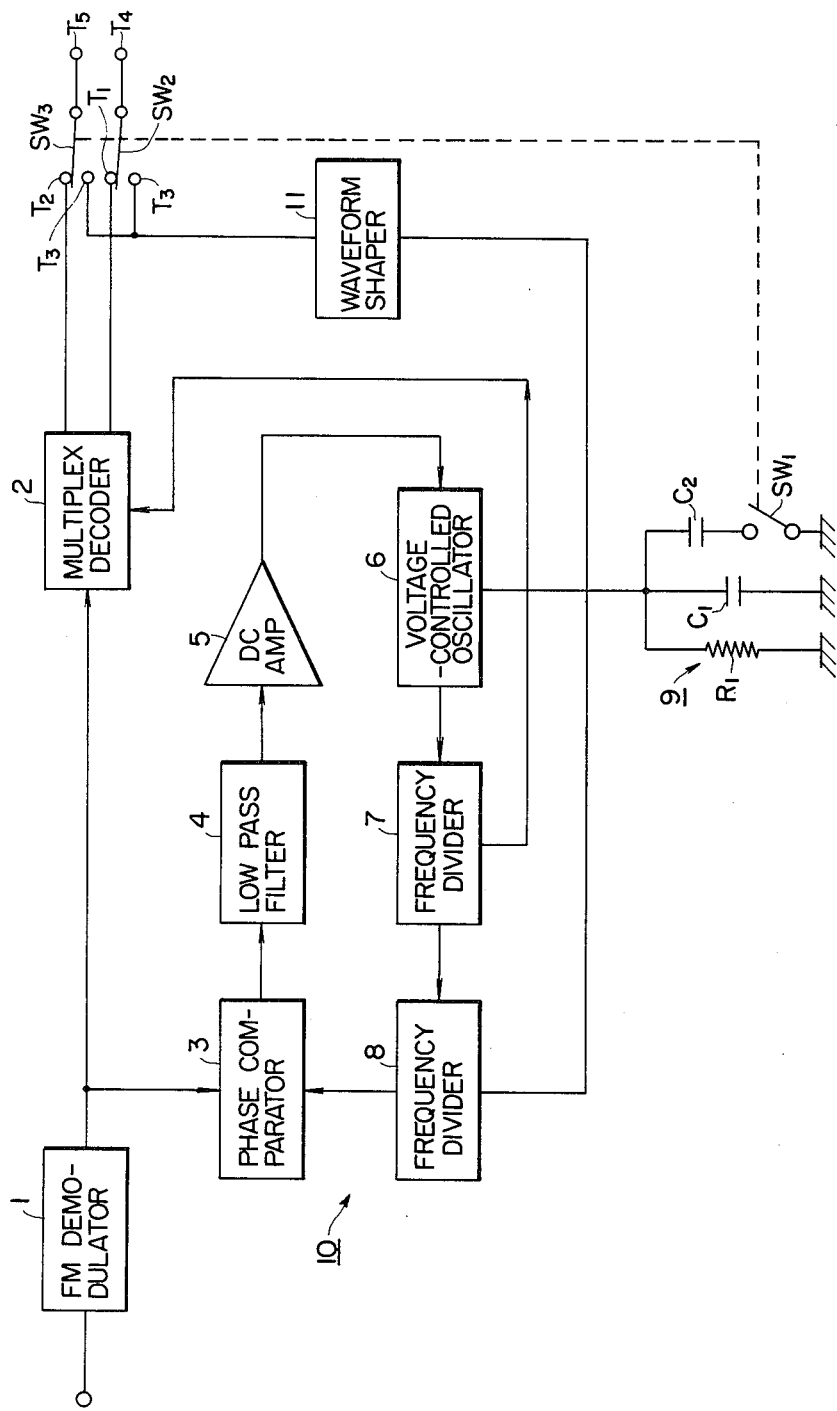

FM STEREOPHONIC RECEIVER PROVIDING A TEST SIGNAL

BACKGROUND OF THE INVENTION (a) Field of the invention

The present invention is related to radio receiver, and more particularly it pertains to an FM stereophonic receiver having a system for producing a test signal to be used for setting the input level of a tape-recorder recording an FM program through the receiver.

(b) Description of the prior art

When recording an FM program through an FM stereophonic receiver by a tape-recorder, it is important to properly set the input level of the tape-recorder because FM programs have considerably wide dynamic ranges. In case the tape-recorder has an excessive input level, the recorder signal of the FM program will contain amplitude distortions to a great extent. Conversely, if the input level is too low, the recorded signal will be accompanied by increased noises. In order to achieve an optimum condition, in general, the input level should be set so that the VU (recording input level) meter provided on the tape-recorder will indicate +3VU in case an FM broadcast signal of 100% modulation is received by the receiver through which the tape-recorder records an FM program.

An FM stereo tuner according to the prior art, however, is equipped with no system for producing a test signal intended to be used for input level setting of the tape-recorder. In the past, therefore, it has been necessary, for the accomplishment of the input level setting, to use an audio signal generator to produce therefrom a test signal having the same amplitude as the receiver output does when the receiver receives an FM broadcast signal of 100% modulation degree.

SUMMARY OF THE INVENTION

It is, therefore, an object of the present invention to provide a stereophonic receiver which includes a system for producing a test signal having an audio frequency and a constant amplitude for use to accomplish the input level setting of the tape-recorder connected to the receiver to record a broadcast program through the tuner.

Another object of the present invention is to provide an FM stereophonic receiver of the type described wherein the system utilizes as its essential component a voltage-controlled oscillator involved in the phase-locked loop circuitry provided in the receiver for generating the sub-carrier signal necessary for multiplex decoding.

These and other objects as well as the features and the advantages of the present invention will become apparent by reading the following detailed description of the preferred embodiment when taken in conjunction with the accompanying drawing.

BRIEF DESCRIPTION OF THE DRAWING

The FIGURE is a schematic block diagram illustrating an example of an FM stereophonic receiver embodying the present invention.

DETAILED DESCRIPTION OF THE PREFERRED EMBODIMENT

Referring to the Figure, an FM demodulator 1 receives an FM broadcast signal through the preceding stages not shown, including an RF stage, a converter stage, an IF stage and a limiter stage, thus demodulating the receiver signal to a composite signal. The composite signal consists of a main-channel signal, a sub-channel signal and a pilot signal. A phase-locked loop circuitry, which is generally indicated at 10, is composed of a phase comparator 3, a low pass filter 4, a DC amplifier 5 receiving the output of the phase comparator 3 through the low pass filter 4, a voltage-controlled oscillator 6 which oscillates at a frequency depending upon the controlling voltage applied thereto, i.e., the output of the DC amplifier 5, and frequency dividers 7 and 8 through which the output of the voltage-controlled oscillator 6 is supplied to the phase comparator 3 after being frequency-divider. These frequency dividers 7 and 8 may comprise flip-flop circuits. The phases of the pilot signal in the composite signal and of a first output signal of the frequency divider 8 are compared by the phase comparator 3, and through the low pass filter 4 is delivered out a DC voltage having a value and a polarity both being associated with the phase difference between those two signals. The DC voltage is amplified by the DC amplifier 5, which, in turn, is applied as the frequency-controlling voltage to the voltage-controlled oscillator 6.

When the phase-locked loop circuitry 10 is in the phase locked state, the voltage-controlled oscillator 6 oscillates at, for instance, 76 kHz in synchronism with the pilot signal, and the frequency divider 7 delivers first and second output signals both of 38 kHz, whilst the frequency divider 8 produces first and second output signals both of 19 kHz. The second output signal from the frequency divider 7 is adapted to be fed to a multiplex decoder 2 as a sub-carrier signal which has the same frequency and phase with those of the sub-carrier signal used for the modulation of the sub-channel signal at the broadcast station. When the phase-locked loop circuitry 10 is out of phase-lock, the voltage-controlled oscillator 6 oscillates at a free-running frequency determined by the time-constant value of a time-constant network circuit 9 composed of resistor $R_1$ and capacitor $C_1$, the free-running frequency being set nearly equal to 38 kHz.

The multiplex decoder 2 operates using the sub-carrier signal received from the phase-locked loop circuitry 10, to decode the main-channel signal and the sub-channel signal in the composite signal from the FM demodulator 1, thus restoring separately a left-audio signal and a right-audio signal each being produced at the broadcast station. The restored left-and right-audio signals are delivered out to terminals $T_1$ and $T_2$ of the decoder 2, respectively.

The improved FM stereophonic receiver according to the present invention further includes a system for producing a test signal of an audio frequency and of a constant amplitude to be used for setting the input level of a tape-recorder when is to be connected to the receiver to record an FM program through the receiver. The system in this embodiment is composed of the frequency dividers 7 and 8, the voltage-controlled oscillator 6, a capacitor $C_2$, a switch $SW_1$ and a waveform shaper circuit 11. When the switch $SW_1$ is closed to thereby connect the capacitor $C_2$ of a suitable value in parallel to the time-constant network circuit 9, the time-constant value of the circuit 9 is changed so that the voltage-controlled oscillator 6 will oscillate at an audio frequency of, for example, 4 kHz. Accordingly, from the frequency divider 8 is obtained a test signal as the second output signal of the frequency divider 8, which test signal is, after being converted to a required waveshape through the waveform shaper 11, supplied to terminals T₃. It should be noted that the waveform shaper 11 may be omitted if allowed.

The output terminals T₄ and T₅ of the receiver, which are for connecting the receiver outputs to an external equipment such as a tape-recorder, an amplifier and so forth, are selectively connected through switches SW₂ and SW₃ to either the terminals T₁ and T₂ or terminals T₃. The switches SW₂ and SW₃ are ganged to the switch SW₁ in such a manner that, when the switch SW₁ is closed, the switches SW₂ and SW₃ may operate to connect therethrough terminals T₃ to the terminals T₄ and T₅, and that when the switch SW₁ is opened, the switches SW₂ and SW₃ may operate to connect therethrough the terminals T₁ and T₂ to the terminals T₄ and T₅. As such, by operating the ganged switches SW₁, SW₂ and SW₃, it is possible, at will, to deliver out from the terminals T₄ and T₅ either the restored left- and right-audio signals or the test signal.

The system for producing the test signal preferably is so arranged that the produced test signal may provide a constant amplitude which is precisely equal to each that of the restored left- and right-audio signals when the receiver receives an FM broadcast signal of 100% modulation.

As described previously, the FM stereophonic receiver of the present invention includes the system for producing the test signal, so that the input level setting of tape-recorder recording an FM program through the receiver can be accomplished easily, only by using the produced test signal and without using any audio signal generator. Particularly, with the arrangement of the above-mentioned embodiment, the input level setting can be done with the tape-recorder connected to the receiver.

It will be understood by those skilled in the art that changes and modifications may be made to the above-described FM receiver without departing from the spirit and scope of the present invention as set forth in the claims appended hereto. For instance, the system for producing the test signal may be modified so that the test signal is derived from a certain point other than that in the embodiment, in the phase-locked loop circuitry, such as from the output point of the voltage-controlled oscillator, the first output point of one of the frequency dividers. Moreover, the system mentioned above is so arranged that the oscillation frequency of the voltage-controlled oscillator may be changed by alternating the time-constant value of the time-constant network circuit, and it is possible to design the system so that the oscillation frequency of the voltage-controlled oscillator may be changed by any suitable means other than the above means.

What is claimed is:

1. An FM stereophonic receiver for receiving an FM stereophonic broadcast signal and thereby for restoring a left- and a right-audio signal produced at a broadcast station transmitting the FM stereophonic braodcast signal, including:

an FM demodulator for demodulating the receiver FM stereophonic broadcast signal to thereby produce a composite signal consisting of a main-channel signal, a sub-channel signal and a pilot signal;

a phase-locked loop circuitry for regenerating a sub-carrier signal used at said broadcast station to produce said sub-channel signal, comprising a voltage-controlled oscillator whole oscillating frequency is controllable in accordance with a control voltage applied thereto, a phase comparing circuit for generating said control voltage having a value and a polarity both being associated with a difference in the phase between said pilot signal and a comparison signal of which frequency and phase both being associated with those of an output signal of said voltage-controlled oscillator, circuit means coupled to said voltage-controlled oscillator for producing said comparison signal and said sub-carrier signal;

a multiplex decoder, having a first and a second output terminal, for receiving said main-channel signal, sub-channel signal and sub-carrier signal supplied from said circuit means to thereby restore separately said left-audio signal and said right-audio signal, these left- and right-audio signals being delivered out on said first and second output terminals, respectively; and test signal producing means including said voltage-controlled oscillator as an essential element of said means, for producing a test signal having an audio frequency and a constant amplitude, said test signal being delivered out at a third output terminal.

2. An FM stereophonic receiver according to claim 1, wherein said test signal producing means further includes a first means for causing said voltage-controlled oscillator to oscillate at a frequency such that said audio frequency of said test signal is assumed by a signal appearing at a certain point of said phase-locked loop circuitry, and a second means for deriving said test signal from said certain point and for supplying the derived test signal to said third output terminal.

3. An FM stereophonic receiver according to claim 1, wherein said constant amplitude of said test signal is substantially the same as that of said left- and right-audio signals delivered at said first and second output terminals when said FM stereophonic broadcast signal received is of 100% modulated.

4. An FM stereophonic receiver according to claim 2, wherein said first means comprises a time-constant network circuit having a time constant value thereof for determining the free-running frequency at which said voltage-controlled oscillator oscillates freely without application thereto of said control voltage, and time-constant varying means for changing said time-constant value of said-constant network circuit to thereby vary said free-running frequency.

5. An FM stereophonic receiver according to claim 4, wherein said time-constant varying means comprises a capacitor, and a first switch for connecting and disconnecting said capacitor to and from said time-constant network circuit.

6. An FM stereophonic receiver according to claim 5, further including a second and a third switch ganged to each other, and a fourth and a fifth terminal, said fourth and fifth terminals being selectively connected to said first and second output terminals and in common to said third output terminal through said second and third switches.

7. An FM stereophonic receiver according to claim 6, wherein said first switch is ganged to said second and third switches so that, when said first and second output terminals are connected through said second and third switches to said fourth and fifth terminals said capacitor is disconnected from said time-constant network circuit by said first switch, and that, when said thrid output terminal is connected to said fourth and fifth terminals, said capacitor is connected to said time-constant network circuit by said first switch.

8. An FM stereophonic receiver according to claim 2, wherein said circuit means comprises a first circuit and a second circuit, said first circuit receiving a signal from said second circuit and producing said comparison signal and said second circuit further producing said sub-carrier signal.

9. An FM stereophonic receiver according to claim 8, wherein said first circuit comprises a frequency divider having an input terminal associated with said output signal of said voltage-controlled oscillator and a pair of output terminals, one of said pair of output terminals delivering said comparison signal therefrom, the other of said pair of output terminals being said certain point.

10. An FM stereophonic receiver according to claim 8, wherein said second circuit comprises a first frequency divider receiving said output signal of said voltage-controlled oscillator and having a first pair of output terminals, one of said first pair of output terminals delivering said sub-carrier signal therefrom, and wherein said first circuit comprises a second frequency divider receiving said outputted on the other of said first pair of output terminals and having a second pair of output terminals, one of said second pair of output terminals delivering said comparison therefrom, the other of said second pair of output terminals being said certain point.

* * * * *

UNITED STATES PATENT AND TRADEMARK OFFICE
CERTIFICATE OF CORRECTION

PATENT NO. : 4,124,780
DATED : November 7, 1978
INVENTOR(S) : Minoru OGITA

It is certified that error appears in the above-identified patent and that said Letters Patent are hereby corrected as shown below:

In the Specification

Column 2, line 35, change "for the modulation of" to
--to produce--

In the Claims

Claim 1, column 3, line 61, change "receiver" to --received--
column 3, line 68, change "whole" to --whose--

Claim 3, column 4, line 39, delete "of"

Claim 4, column 4, line 47, change "said-constant" to
--said time-constant--

Claim 10, column 6, line 10, before "outputted" insert
--signal from said second circuit--
column 6, line 13, after "comparison" insert
--signal--

Signed and Sealed this

Twenty-sixth Day of June 1979

[SEAL]

Attest:

RUTH C. MASON
Attesting Officer

DONALD W. BANNER
Commissioner of Patents and Trademarks